United States Patent [19]

Courduvelis et al.

[11] Patent Number: 4,592,852

[45] Date of Patent: Jun. 3, 1986

[54] COMPOSITION AND PROCESS FOR TREATING PLASTICS WITH ALKALINE PERMANGANATE SOLUTIONS

[75] Inventors: Constantine I. Courduvelis, Orange; Anthony R. Del Gobbo, Watertown, both of Conn.

[73] Assignee: Enthone, Incorporated, West Haven, Conn.

[21] Appl. No.: 618,281

[22] Filed: Jun. 7, 1984

[51] Int. Cl.[4] .......................... C23C 18/22; C23F 1/32
[52] U.S. Cl. .................................. 252/79.1; 156/668; 156/642; 427/307; 427/97; 252/79.5
[58] Field of Search ............................ 252/79.1, 79.5; 156/668, 642; 427/307

[56] References Cited

U.S. PATENT DOCUMENTS

| | | | |
|---|---|---|---|
| 3,425,947 | 2/1969 | Rausch | 252/79.5 |
| 3,652,351 | 3/1972 | Guisti | 156/668 |
| 3,833,414 | 9/1974 | Grisik | 252/79.5 |
| 4,042,729 | 8/1977 | Polichette | 156/668 |
| 4,073,740 | 2/1978 | Polichette | 252/156 |
| 4,425,380 | 1/1984 | Nuzzi | 156/668 |
| 4,474,677 | 10/1984 | Foxlee | 252/173 |

FOREIGN PATENT DOCUMENTS

| | | | |
|---|---|---|---|
| 54-3169 | 1/1979 | Japan | 156/668 |
| 52-55933 | 4/1982 | Japan | 427/309 |

OTHER PUBLICATIONS

Nuzzi, "An Improved Permanganate Smear Removal Process", PC FAB., pp. 58, 60–63, Mar. 1984.

*Primary Examiner*—John D. Smith
*Attorney, Agent, or Firm*—John J. Tomaszewski; Kenneth A. Koch

[57] ABSTRACT

An improved alkaline permanganate composition for etching printed circuit boards is provided by incorporating a secondary oxidant in the solution capable of oxidizing manganate ion to permanganate ion.

10 Claims, No Drawings

COMPOSITION AND PROCESS FOR TREATING PLASTICS WITH ALKALINE PERMANGANATE SOLUTIONS

BACKGROUND OF THE INVENTION

The invention relates to the metal plating of plastics and, in particular, to enhancing the adhesion of metal plating to the plastic substrate of electronic circuit boards by treating the board with an alkaline permanganate solution prior to electroless metal plating of the board.

The metal plating of plastic parts is well-known to be of considerable commercial importance because the desirable characteristics of both the plastic and the metal are combined to offer the technical and aesthetic advantages of each. Thus, a part plated with a bright, metallic finish takes advantage of the economies in cost and weight afforded by substituting molded plastic parts for metal and, additionally, the plated finishes are not as susceptible to pitting and corrosion because there is no galvanic reaction between a plastic substrate and a plated metal.

An important process is the preparation of electronic circuit boards which requires the elctroless plating of a conductive metal layer, usually copper, onto the plastic substrate of the board, such as epoxy, and for convenience the following description will relate specifically to this process.

These boards vary in design and may have a copper layer on each surface of the epoxy (two-sided boards) or they can be multi-layer boards which have a plurality of inter-leaved parallel planar copper and epoxy layers. In both type boards through-holes are drilled in the board and metal plated to facilitate connection between the circuits on the copper layers. The through-holes present an additional plating problem because resin smear on the exposed copper caused by the drilling operation acts as an insulator between the metal of the through-hole and copper layer and must be removed prior to plating. The smear is usually removed using acid and this process degrades the physical integrity of the hole making it difficult to metallize and provides little or no adhesive support for the metallic deposit.

The problems in plating either the through-holes or other plastic parts of the board are well-known in the art and a number of methods have been developed to improve the adhesion of the metal plating to the epoxy. These methods generally employ oxidants to etch the surface of the plastic prior to plating and include chromic acid, sulfuric acid and acidic and alkaline permanganate solutions. The toxicity of the chromium compounds and their potential hazards as water pollutants and the safety precautions needed with sulfuric acid have increased the commercial use of permanganate solutions, particularly alkaline permanganate solutions, and a number of patents have been granted in this area.

U.S. Pat. No. 3,652,351 shows the etching of acrylonitrile-butadiene-styrene interpolymers (ABS plastics) using a composition containing manganate and hydroxyl ions. U.S. Pat. Nos. 4,042,729 and 4,054,693 disclose stable, highly active etching solutions containing particular ratios of manganate ions and permanganate ions by controlling the pH in the range of 11 to 13. U.S. Pat. No. 4,425,380 is specifically directed to cleaning through-holes of residual manganese prior to plating by contacting the etched plastic with a water soluble compound oxidizable by permanganate to reduce the manganese residues to a low oxidation state, e.g., $SnCl_2$-HCl, formaldehyde, followed by contacting with hot alkaline hydroxide. The disclosures of the above patents are hereby incorporated by reference.

The present invention relates to treating the plastic surface before plating and particularly to etching the plastic with an alkaline permanganate solution to remove smear and to improve the adhesiveness of the metal plate to the plastic board. U.S. Pat. No. 4,042,729, supra, attempted to improve the use of alkaline permanganate solutions to treat plastic circuit boards and notes the many problems associated with these solutions. Thus acidic permanganate solutions are notoriously unstable, have a short life and rapidly decompose to manganese dioxide. Alkaline permanganate solutions present similar problems but, according to the invention, are highly active, easily controllable and stable provided the molar ratio of manganate ion to permanganate ion is up to about 1.2 and the pH of the solution is controlled in the range of 11 to 13 by the use of buffers or pH adjustors. The patent also provides a means for rejuvenating the bath to remove organics and produce permanganate by disproportionation of manganate comprising bubbling $CO_2$ into the bath to lower the pH from 12.5 to 11 to 11.5, heating to form permanganate ions and manganese dioxide from the manganate ions, cooling, precipitating carbonates and filtering to remove the manganese dioxide and carbonates. The preparation and control of the compositions and rejuvenating procedures of this patent are unwieldly and time consuming and there is a need for improved alkaline permanganate etching solutions and methods for using the solutions to etch plastic substrates.

SUMMARY OF THE INVENTION

It has now been discovered that alkaline permanganate etching compositions comprising permanganate ions and a secondary oxidant capable of oxidizing manganate ions to permanganate ions are highly effective to treat plastic substrates prior to electroless metal deposition of the plastic. The improved compostions when used to treat plastics such as epoxy and other resins exhibit excellent stability and long term operating life. The formation of undesirable lower oxidation state manganese products such as manganese dioxide, is lowered and additionally, the activity of the solution is also unexpectedly enhanced and shorter treatment times are generally required than with prior art compositions.

It is another important unexpected feature of the invention that the improved alkaline permanganate etching process proceeds without any significant adverse operating effects which would, for example, increase the number of treated parts being rejected for failing to meet specifications. While no theory can be advanced for the unexpected results achieved when using the compositions of the invention, it remains that the invention provides an etchant composition and procedure for preparing plastic substrates for metallization superior to any known to the prior art.

The alkaline permanganate solutions are well-known in the art and suitable compositions are shown in U.S. Pat. Nos. 4,042,729 and 4,425,380. In general, the permanganate component is present in an amount of about 1 gram per liter (g/l) to the limit of its solubility in the medium and the pH of the composition is alkaline and preferably above about 10, more preferably above about 13, e.g., between 13 and 14. The amount of the secondary oxidant component having an oxidation potential greater than the oxidation potential of the alkaline permanganate solution may vary widely from about 0.5 gram equivalent of oxidant per gram equivalent of the manganate ion concentration to a stoichiometric amount, or more.

The composition is employed at an elevated temperature and is, in general, about 90° F. to the lesser of the boiling point of the solution and the softening point of the plastic. For epoxy boards the temperature is preferably about 140° to 160° F.

The effective contact time will vary with the concentration and temperature of the solution and the plastic substrate being treated and in general will not exceed about 30 minutes, preferably 5 to 15 minutes, e.g., 10 minutes. For epoxy boards a contact time of about 8-12 minutes at a temperature of about 145°-155° F. has been found to provide excellent results.

In general and for purposes of illustration, the process of using the compositions of the invention in manufacturing printed circuit boards and, in particular, boards containing through-holes, is a sequence of steps commencing with a commercially available laminate or multi-laminate made from, e.g., paper-epoxy or glass-epoxy material. A predesigned series of through-holes is formed in the board in any conventional manner, then preferably etched with an acid to remove any epoxy smear over the exposed metal laminate surface and to etch-back the epoxy layer, and water rinsed. This may be followed by contacting the board with a swellant type composition to enhance the effect of the subsequent permanganate etching step as described in U.S. Pat. Nos. 3,758,732; 3,865,623 and 4,086,128, the disclosures of which are hereby incorporated by reference. After water rinsing, the board is etched with the alkaline permanganate solution of the invention and water rinsed. Neutralization with a reductant to solubilize manganese residues by lowering their oxidation state is then performed and the board rinsed providing a board having all the copper layers in the through-holes exposed and the epoxy etched ready for electroless metal plating using conventional procedures. A preferred step is to now dissolve some of the glass fibers in the epoxy using, for example, acid fluorides, and to pretreat the board by cleaning with a composition such as ENPLATE®PC-475 to remove hydrocarbon soils and oxides and micro-etching of the copper using an etchant such as ENPLATE AD-485. Thereafter the board is immersed in a catalyst, such as a tin-palladium solution, which conditions the surface of the epoxy for electroless copper plating. ENPLATE Activator 444 sold by Enthone, Incorporated is exemplary of this type catalyst. Following a water rinse, the laminate is immersed in an accelerator such as ENPLATE PA-491 to activate the catalyst by freeing the metal palladium ions on the board. After a water rinse, the board is dried and is immersed in an electroless copper plating solution for a period of time sufficient to plate copper to the desired thickness on the surfaces and to plate the surfaces of the holes to form through-hole connections between the laminate surfaces. ENPLATE CU-700 and other similar plating compositions may be employed. The boards may then be electroplated using conventional techniques if a thicker coating is desired.

DETAILED DESCRIPTION OF THE INVENTION

The compositions of the invention have been found to be particularly useful for treating epoxy resins although other suitable polymeric resins may also be conditioned. The electronic circuit boards are commercially available and are of known structure and composition and include paper-epoxy and glass-epoxy laminates. In general, an epoxy resin means a polymeric compound containing at least two epoxy groups in one molecule and synthetic resins formed by ring-opening reactions of the epoxy groups of the compounds. An epoxy resin extensively used in the printed circuit industry is a cured epoxy resulting from a condensation product of epichlorohydrin and bisphenol A. A board termed FR-4, which is a fire retardant epoxy resin fiber glass cloth laminate, has demonstrated to be effectively treated by the process of the invention.

The epoxy resin may contain glass fibers, paper, synthetic fibers, carbon black, alumina powders, silica powders, wax, etc. as fillers, pigments, mold release agents, reinforcing agents, etc., or can be used together with phenol resins, urea resins, melamine resins, and the like.

The alkaline pH of the composition may be provided by any suitable source and is preferably an alkaline hydroxide such as lithium, sodium, potassium, cesium, and tetraalkyl ammonium. Sodium hydroxide and potassium hydroxide are preferred. The amount of hydroxyl ions can vary widely and is preferably about 10 to 150 g/l, or higher, and more preferably about 20 to 90 g/l, most preferably 30-70 g/l. It is preferred to measure the hydroxide ion concentration at predetermined intervals and to add more alkali as needed to maintain the desired concentration.

Any source of permanganate ion may be employed which is stable and soluble in the solution. It is preferred to employ alkali metal or alkaline earth metal salts such as sodium, potassium, lithium, cesium, calcium, etc., with potassium permanganate being preferred because of its availability and demonstrated effectiveness.

The amount of permanganate salt used in the solution may vary widely from about 1 g/l up to the limit of solubility in the medium. A preferred range is about 10 g/l to 100 g/l and more preferably about 40 g/l to 90 g/l, e.g., 50-70 g/l.

The other essential component of the composition is a material having an oxidation potential higher than the oxidation potential of the permanganate solution and which is capable of oxidizing manganate ions to permanganate ions. While any such oxidant may be used, it is preferred that the oxidant have an oxidation potential greater than about 10% higher than the oxidation potential of the permanganate solution, and more preferably greater than about 25%, e.g., 50-100%, or higher. Exemplary oxidants include chlorine, bromine, ozone, hypochlorite salts, metaperiodate salts, trichloro-s-triazinetrione and its salts, and the like. Sodium hypochlorite is preferred because of its ease of use, availability, low cost and demonstrated effectiveness. Commercially available 13% by weight sodium hypochlorite solution (15% available chlorine) has provided excellent results.

The amount of oxidant employed may vary widely and, in a preferred embodiment, is correlated to the manganate ion concentration of the permanganate solution and, most preferably, to the total manganate ion plus permanganate ion concentration. In general, for a hypochlorite salt, a range of about 1 g/l to 100 g/l, or more, may be employed, preferably 5 g/l to 50 g/l, e.g., 5 g/l to 25 g/l.

It is an important feature of the invention that permanganate ions be present at the desired concentration in order to maintain the activity of the solution. As is well-known in the art, manganate ion is formed during the treatment process which reduces the activity of the solution and leads to other undesirable results such as manganese dioxide sludge formation. The use of the secondary oxidant in the composition in effective oxidizing amounts maintains the activity of the solution, stabilizes the solution, consumes less of the expensive permanganate salt while consuming a secondary oxidant which, in many cases, is much less expensive than the permanganate salt, among other benefits.

While different methods can be employed to practice the invention, it is preferred that at desired intervals during the process the concentration of permanganate and manganate ions be determined by analytical techniques. The ratio of permanganate ion concentration to the sum of the permanganate ion and manganate ion concentrations is calculated with a ratio greater than about 0.5 being desired, and increasing ratios providing, in general, a preferred process. A ratio greater than about 0.7 is preferred, with ratios greater than about 0.8 and 0.9 being most highly preferred. Depending on the ratio, an effective amount of the secondary oxidant is added, as needed, to the solution to control the ratio at the desired level. Amounts of oxidant will vary and can be readily determined by those skilled in the art. Preferably, the ratio is determined, and, if, for example, is less than 0.7, 3% by volume of a 13% by weight NaOCl solution is added to the bath. After about 1 hour the ratio is again determined and should be above the operating level of 0.7. Since higher ratios are preferred, if the ratio is say between 0.8 and 0.85, it has been found effective to add 1% by volume of the NaOCl solution to the bath. This will maintain the ratio, depending on usage of the bath, for an operating period of at least a day (24 hours). It is preferred to analyze the bath on a daily basis and to make adjustments as needed as will be appreciated by those skilled in the art.

It is another important feature of the invention that the permanganate ion concentration be also maintained at a predetermined level in the solution, e.g., its original concentration. Permanganate ions may be added to the solution to bring the solution to the desired permanganate ion concentration based on the determined permanganate ion concentration. It has been found that highly satisfactory operating results have been achieved by summing the permanganate ion and manganate ion concentrations and adding permanganate ions based on this value and this procedure is preferred based on its demonstrated effectiveness. Thus, based on potassium permanganate, if a permanganate concentration of 65 g/l is desired and the sum of the potassium permanganate and potassium manganate concentration is 55 g/l, 10 g/l of potassium permanganat would be added to the solution.

Other additives, such as wetting agents, may be used in the composition for special purposes as is known in the art.

The composition media is preferably aqueous and substantially inert with respect to the plastic being treated. Other media may also be employed such as alcohols with water being preferred for economic reasons and for its demonstrated effectiveness.

To practice the method of the invention the plastic substrate is contacted with the composition at an elevated temperature for a time sufficient to render the surface receptive to the electroless metal plating process. Contacting procedures may vary widely and satisfactory results for epoxy resin are provided by immersing the part in the solvent for between approximately 5 to 15 minutes at 140° to 160° F. The time and temperature will vary depending on the substrate being treated and the compostion of the solution as will be appreciated by those skilled in the art. Other means such as spraying, may be used for treating the plastic part.

The treated plastic part is then rinsed to remove excess solution and manganese residues removed by neutralization or chemical reduction using reductants such as hydrazine and oxalic acid.

The etched plastic part is now prepared for electroless metal plating by known means as described in U.S. Pat. Nos. 2,874,072; 3,011,920; 3,075,855: 3,095,309; 3,672,938 and 3,736,156: the disclosures of said patents being hereby incorporated by reference. In general, the plastic surface is catalyzed employing a solution containing tin and palladium followed by treatment with an accelerator solution, usually an acid, to remove excess tin and provide a palladium rich surface. The plastic is now ready for plating with an electroless metal bath such as copper. Other methods of deposition may also be used such as vacuum vapor deposition, electrolytic plating or a combination of electroless plating and electrolytic plating.

The present invention will now be described in detail by reference to the following examples.

EXAMPLE I

The following example illustrates the use of the composition to provide an efficient, effective method for the electroless metal plating of a printed circuit board.

A two-sided copper clad epoxy-glass FR-4 laminate board was metallized using the following procedure:
(a) strip the copper clad from the surface of the board with 50% HNO₃ at room temperature;
(b) rinse in water;
(c) clean the surface with 96% sulfuric acid for 45 seconds at room temperature;
(d) rinse in water for 5 minutes;
(e) immerse for 5 minutes at 140° F. with mild agitation in a solution comprising:

| | |
|---|---|
| Sodium hydroxide | 90 g |
| N—Methyl-2-pyrrolidone | 100 ml |
| Ethyleneglycol monobutyl ether | 20 ml |
| Water (to make) | 1000 ml |

(f) rinse for 5 minutes in water;
(g) etch for 10 minutes at 150° F. with mild agitation in a solution comprising:

| | |
|---|---|
| KMnO₄ | 65 g |
| NaOH | 50 g |
| NaOCl | 10 g |
| Water (to make) | 1000 ml |

(h) rinse for 5 minutes in water;
(i) neutralize for 5 minutes at 140° F. in a solution comprising:

| Hydrazine.H₂SO₄ | 25 g |
|---|---|
| HCl (37% aqueous) | 30 ml |
| Water (to make) | 1000 ml |

(j) rinse in water for 3 minutes;
(k) immerse in a conditioning cleaner such as ENPLATE®PC-475 for 5 minutes at 145° F. (ENPLATE PC-475 manufactured by Enthone, Incorporated, West Haven, Conn.);
(l) rinse in water for 3 minutes;
(m) immerse in a one-step palladium catalyst such as ENPLATE Activator 444 for 5 minutes at 75° F.;
(n) rinse with water;
(o) immerse in a post activator solution such as ENPLATE PA-491 for 5 minutes at room temperature;
(p) rinse in water for 2 minutes;
(q) metallize in an electroless copper solution such as ENPLATE CU-700 for 30 minutes at 118° F.;
(r) rinse with water and air dry.

The metallized layer was tested for adhesion by firmly attaching a strip of adhesive tape to the metallized surface and then removing the tape with a quick snapping motion. There was no transfer of the metallized deposit to the adhesive backing of the tape.

EXAMPLE II

The following example illustrates the use of the composition to provide an efficient, effective method for treating a printed circuit board.

A multi-layer FR-4 epoxy fiberglass copper clad board having drilled through-holes was metallized using the following procedure:

(a) immerse the board for 5 minutes at 140° F. in a solution comprising:

| N—methyl-2-pyrrolidone | 50 ml |
|---|---|
| Ethyleneglycol monobutyl ether | 10 ml |
| Sodium hydroxide | 45 g |
| Water (to make) | 500 ml |

(b) rinse in water;
(c) immerse the board for 10 minutes at 150° F. in a solution comprising:

| Potassium permanganate | 30 g |
|---|---|
| Sodium hydroxide | 25 g |
| Sodium hypochlorite | 5 g |
| Water (to make) | 500 ml |

(d) rinse in water;
(e) determine the permanganate and manganate concentrations and sodium hydroxide concentration of the solution of step (c) at predetermined intervals;
(f) calculate the ratio of potassium permanganate concentration to the sum of the potassium permanganate and potassium manganate concentration;
(g) add potassium permanganate and sodium hydroxide as needed to maintain their original concentrations the amount of $KMnO_4$ being added based on the original $KMnO_4$ concentration minus the sum of the $KMnO_4$ and $K_2MnO_4$ concentration);
(h) add sodium hypochlorite to maintain the ratio above 0.8;
(i) repeat steps (a)-(h) until a loading of 90 ft² panel/gallon solution.

The board when metallized by steps (i)-(r) of EXAMPLE I produced strongly bonded metal deposits.

The permanganate solution required 11.8 g $KMnO_4$ to maintain the original permanganate concentration and 29 g NaOCl to maintain a ratio of 0.8 or better. The permanganate solution had no trace of insoluble matter on the bottom of the container.

COMPARATIVE EXAMPLE II

Example II was repeated except that the potassium permanganate solution did not contain sodium hypochlorite. This solution required 15.6 g $KMnO_4$ to maintain the original permanganate concentration and the ratio dropped to 0.40. The solution had an amorphous brownish black precipitate at the bottom of the container.

EXAMPLE II and Comparative EXAMPLE II demonstrate the reduced level of $KMnO_4$ needed to maintain the original concentration of the solution and the lack of insoluble matter contaminating the solution, which matter must be cleaned from the container. The solution of the invention has increased activity compared to the solution not containing NaOCl and lower operating temperatures and/or shorter contact times can be employed. Further, a separate rejuvenation procedure such as shown in U.S. Pat. No. 4,042,729 is not required.

What is claimed is:

1. An alkaline composition for treating plastics to improve the adhesion of electroless metal plating thereto comprising:
    (a) a source of permanganate ions in an amount of about 1 g/l to its limit of solubility; and
    (b) an effective amount of a secondary oxidant capable of oxidizing manganate ion to permanganate ion wherein the secondary oxidant is selected from the group consisting of chlorine, bromine, ozone, hypochlorite salts, metaperiodate salts and trichloro-s-trianzinetrione salts.
2. The alkaline composition of claim 1 wherein the ratio of permanganate ion concentration to the sum of the permanganate ion and manganate ion concentrations is greater than about 0.5.
3. The alkaline composition of claim 2 wherein an effective amount of the secondary oxidant is added, as needed, to the solution to control the ratio above about 0.5.
4. The alkaline composition of claim 3 wherein the secondary oxidant is a hypochlorite salt.
5. The alkaline composition of claim 4 wherein the ratio is maintained above about 0.7.
6. The alkaline composition of claim 1 wherein
    (a) the source of permanganate ion is $KMnO_4$ in an amount of about 10 g/l to 100 g/l;
    (b) the secondary oxidant is NaOCl in an amount of about 1 g/l to 100 g/l; and
    (c) the alkaline source is an alkaline hydroxide in an amount of about 10 g/l to 150 g/l.
7. The alkaline composition of claim 6 wherein
    (a) $KMnO_4$ is about 40 g/l to 90 g/l;
    (b) NaOCl is about 5 g/l to 50 g/l; and
    (c) the alkaline hydroxide is about 20 g/l to 90 g/l.
8. The alkaline composition of claim 1 wherein the secondary oxidant is a hypochlorite salt.
9. The alkaline composition of claim 8 wherein the source of permanganate ion is $KMnO_4$.
10. The alkaline composition of claim 9 wherein the hypochlorite salt is sodium hypochlorite.

* * * * *